HIGH FREQUENCY GERMANIUM TRANSISTOR

Filed Dec. 2, 1959

INVENTOR

Robert E. Anderson

BY Stevens, Davis, Miller & Mosher

ATTORNEYS

United States Patent Office 3,084,078
Patented Apr. 2, 1963

3,084,078
HIGH FREQUENCY GERMANIUM TRANSISTOR

Robert E. Anderson, Kingsville, Tex., assignor to Texas Instruments Incorporated, Dallas, Tex., a corporation of Delaware Filed Dec. 2, 1959, Ser. No. 856,735
6 Claims. (Cl. 148—1.5)

This invention relates to a method for making transistors especially useful in high frequency applications and, more particularly, to a method for making, by the grown diffused technique, improved germanium transistors characterized by an intrinsic region resulting in low noise characteristics.

It has been found that certain desirable characteristics of high frequency transistors are enhanced when there is included in the physical structure of the device a so-called intrinsic or I region located between the base region and the collector region of the device. Such a region may be either one which is substantially free of significant impurities, i.e., donors or acceptors, or one in which the number of donor atoms is substantially equal to the number of acceptor atoms so that the effects of one type impurity compensate for the effects of the other type impurity.

Previous to the present invention, transistors containing such an I region, generally designated as PNIP or NPIN transistors, were fabricated by several processes. By one process, a slice of intrinsic semiconductor material is subjected to a diffusion process to create a zone of a definite conductivity type, either P or N, below one surface of the slice. Thereafter, impurity dots of an opposite type impurity are alloyed to opposite surfaces of the wafer. Thus, the material of the unchanged portion of the wafer is the I region, the diffused portion of the wafer is the base region and the alloyed portions of the device constitute the emitter and collector regions. However, this process involves two entirely separate processes, diffusion and alloying, and, of course, the different equipment necessary to carry out each process.

A second process involves only diffusion. By this process, an intrinsic wafer may have diffused into it by a series of diffusion operations, impurities of the proper type and in the proper order to produce the desired structure. Alternately, a wafer of one definite conductivity type may have diffused into it a proper amount of an opposite type impurity to create in the wafer a compensated or I region. Thereafter, a diffused region of the opposite type conductivity is created adjacent the I region and by still another diffusion step, a region of the first type conductivity type is created adjacent the region of opposite type conductivity. Since each diffusion of an impurity may take from 10 to 100 hours, it can be seen that the several separate diffusion steps of these two processes require entirely too much time to be commercially practical.

By still a third method, a semiconductor crystal, from which the transistor bars are to be cut, is initially grown in a PNIP or NPIN configuration. This configuration is accomplished by starting the crystal growth from a melt containing one type of significant impurity. After a sufficient length of crystal has been grown from this melt, a critical amount of an opposite type significant impurity is put into the melt. The amount must be exactly the right amount to compensate the impurities already present in the melt. After another period of growth, during which the I region is produced, more of the second type impurity is added to the melt. After the base region, which will be a conductivity type opposite the first grown region, is grown, a sufficient amount of the first type significant impurity to overcome the second type impurity is added to the melt and the final portion of the crystal grown. Because the amounts of the impurities added to the melt at the various times in this process are extremely critical, the yield of usable crystals is very low, and, as a consequence, the usable devices made thereby are prohibitively expensive.

By the process of the present invention, PNIP germanium crystals are produced using the grown diffused technique. This process has the advantages of speed and economy over the above-outlined multiple diffusion and alloy-diffused processes. Because the diffusion constants of the impurities to be added to the melt are the principal governing factors of the process of the present invention rather than the exact specific amounts of impurities added, the process of the present invention is much less critical and, therefore, more useful as a high yield production process.

The novel features that are considered characteristic of the invention are set forth with particularity in the appended claims. The invention itself, however, both as to its organization and its method of operation, together with additional obects and advantages thereof, will be best understood from the following description of the specific embodiment when read in connection with the accompanying drawing, wherein like reference characters indicate like parts throughout the several figures and wherein:

Figure 1:
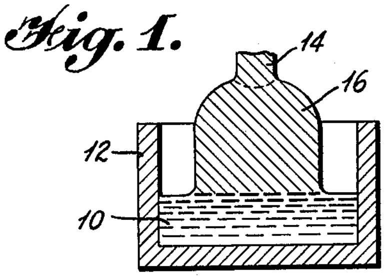
FIGURE 1 is a diagrammatic view in section of a single crystal of germanium being grown from a seed.
Figure 2:
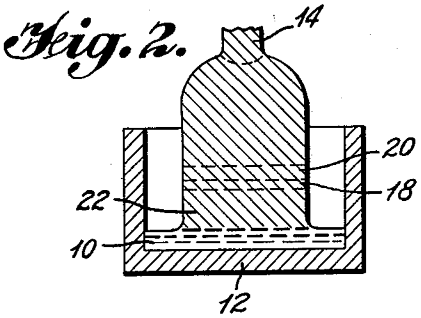
FIGURE 2 is a view similar to FIGURE 1 but at a later stage of crystal growth.

Referring now to the drawing, FIGURES 1 and 2 illustrate different stages in the growth of the crystal by the grown diffused technique. In the practice of this technique according to the present invention, standard crystal growing apparatus of the type well known in the art is used. The collector region 16 of the crystal is grown from a P-type germanium melt 10 by a well known and standard technique. When a sufficient length of the collector region is grown, the growth is stopped and the base and emitter impurities are added simultaneously to the melt. According to the present invention, two different impurities of the same type conductivity are chosen for the impurities of the base or N region. These two impurities have different diffusion constants in germanium and, therefore, will diffuse into the crystal at different rates. The impurity chosen for the P-type emitter region will have a diffusion constant in germanium such that it will diffuse into the crystal at a slower rate than either of the base impurities. After the addition of the base and emitter impurities, growth of the crystal is resumed.

Because of the relative proportions of impurities added to the melt, more P-type than N-type, the material thereafter grown onto the crystal is of P-type and will constitute the emitter region 22 of the transistor. However, some of each of the added impurities will enter the already grown portion of the crystal by the diffusion process. But, because the N-type impurities diffuse at a faster rate in germanium than the P-type impurities, the two N-type impurities will advance into the already grown collector region 16 of the crystal in sufficient quantity to overcome the P-type impurities already present therein and there will be created in the crystal a N-type region 18 which will constitute the base of the transistor. Also, because one of the N-type impurities diffuses at a faster rate in germanium than does the other N-type impurity, the faster diffusing N-type impurity will advance into the P-type collector region 16 a greater distance than the other N-type impurity and in a sufficient amount to compensate the P-type impurities present thereby creating an I region 20 between the N-type base 18 and the P-type collector region 16. Thus, it can be seen that the crystal grown will be of a PNIP configuration. The thickness of the base and I regions thus produced will depend, for the most part, on the particular impurities added, their diffusion rates in germanium and the time they are allowed to diffuse, i.e., the time required to grow the emitter region plus any desired additional diffusion time and to a lesser extent on the particular impurity doping levels of the melt.

A specific example of this invention which has been found to give satisfactory results is described in detail below, but it is included herein by way of example only and not by way of limitation in the practice of the present invention.

The method of the present invention has been carried out successfully as follows. A 100 gram charge 10 of pure germanium and any suitable acceptor type doping material which will yield a collector resistivity of approximately 1 ohm centimeter was placed in crucible 12 of a conventional crystal growing furnace (not shown). In the present example, gallium at a concentration of about $5 \times 10^{15}$ impurity atoms per cubic centimeter was used. The charge of germanium was heated to its melting point in an atmosphere which is inert to germanium. Thereafter, a rotating seed crystal 14 was introduced into the germanium melt 10 and the seed thereafter slowly withdrawn. In this way, crystal growth was initiated. The collector region 16 was grown first. The collector region was grown at a rate of approximately 0.6 mil per second for from 4 to 6 minutes or until approximately one-half the melt is grown onto the crystal as the collector region 16, FIGURE 1. The withdrawal of the crystal was then stopped and the temperature of the melt raised approximately 40° C. to stop the growing process. The impurity materials which form the emitter, base, and I region were then added to the melt. In this specific example, 320 milligrams of a doping alloy were added to the melt. The doping alloy was made by alloying 9 grams of antimony and 80 milligrams of arsenic, the donor impurities, with 1.8 grams of gallium, the acceptor impurity, and 50 grams of germanium. The resulting alloy was then powdered for easy use. The doping alloy was allowed to mix in the melt for approximately 1 minute, then the temperature of the melt was reduced approximately 40° C. and growth of the crystal was resumed for 1 minute at a rate of 0.6 mil per second. The withdrawal of the crystal was stopped and the temperature raised 20° C. to stop the growing process. The crystal remained in this condition for 12 minutes to allow diffusion of the N-type material to form the base region 18 and the I region 20. At the end of the diffusion cycle, the temperature of the melt was again lowered and the emitter region 22 was grown to the desired length at a rate of 0.6 mil per second.

Figure 3:
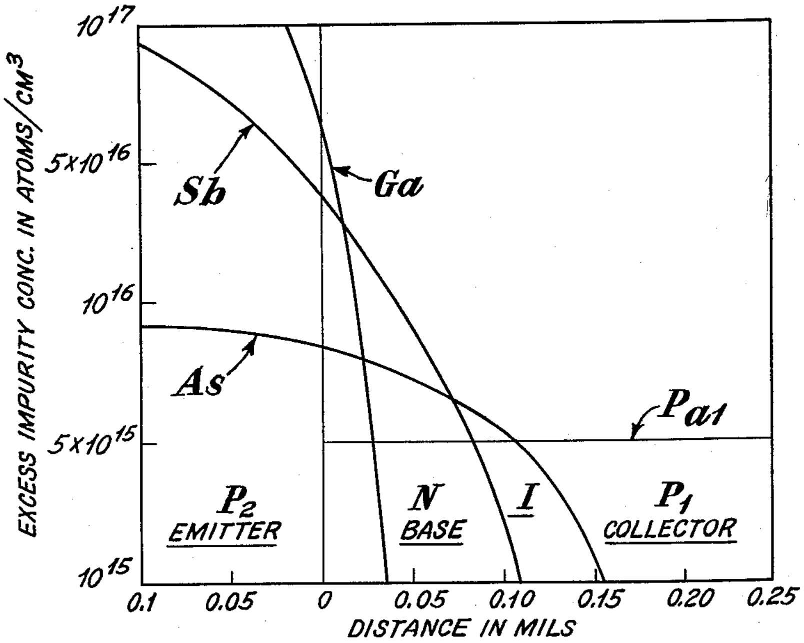
FIGURE 3 is a chart depicting impurity concentration in the grown germanium crystal.
Figure 4:
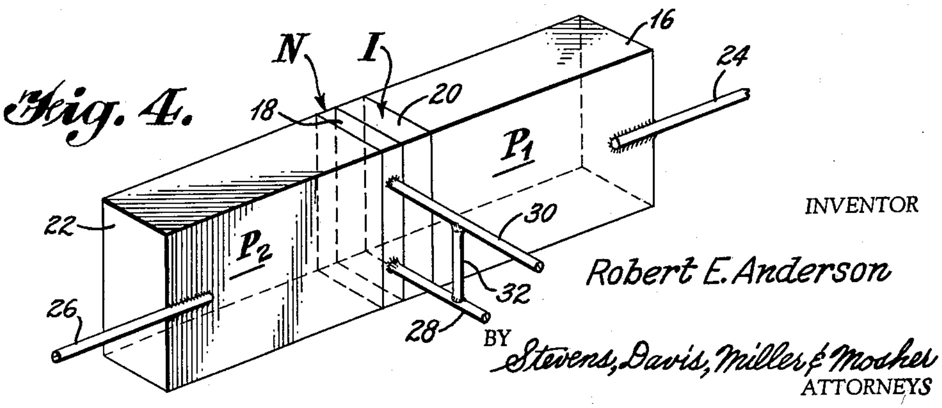
FIGURE 4 is an enlarged perspective view of a transistor cut from the crystal.

While the proportions of impurities added to the melt in this particular example may seem large, it should be realized that considerable amounts of the impurity materials added to the melt do not diffuse into the crystal, but remain in the unused melt. The concentrations of the various donor and acceptor impurities which resulted in the completed grown crystal are illustrated in FIGURE 3. In this figure, the curves showing the excess impurity concentrations plotted against the distance from the emitter junction surface are each labeled with the chemical symbol for the respective material. The initial doping material for growth of the collector is, however, referenced as $P_{a1}$. It will be noted that the resulting N-type base region was less than 0.1 mil in thickness. The concentrations of arsenic and antimony in the N region were substantially greater than that of gallium so that this region has an N-type conductivity. In the I region, the concentrations of $P_{a1}$ substantially balance those of arsenic, the faster diffusing N-type impurity, so that the resulting conductivity was essentially that of intrinsic germanium. Because of the different diffusion rates, very little antimony was present in the I region.

After such a crystal has been formed, it is cut into rectangular segments of desired size which are usually about 20 x 20 x 200 mils with the N-type layer 18 at right angles across the segment near the midpoint. Suitable leads 24 and 26 are attached to the collector 16 or $P_1$ region, and the emitter 22 or $P_2$ region. Two leads 28 and 30 of suitable material are bonded by known techniques to the same face of the base 18. These two leads are connected to each other close to the base region by a jumper lead 32. This double connection while not necessary is desirable since it effectively lowers the base resistance of the device and further enhances its desirable high frequency switching characteristics.

Transistors produced in the described manner have been found to yield excellent results in high frequency switching applications. The collector capacity is very low, about 2 mmf. The resistivity of the I region is in the range of from 10 to 15 ohm centimeters. The resistance of the base region is relatively low, being in the order of 250 ohms at 70 megacycles. Alpha cut-off frequencies of approximately 30 megacycles are attained.

Although a certain specific embodiment of the present invention has been shown and described, it is obvious that many modifications thereof are possible. The invention, therefore, is not be be restricted except as set forth in the appended claims when construed according to the spirit and scope of the present invention.

What is claimed is:

1. The method of producing a grown germanium crystal for making improved germanium transistors which comprises the steps of growing a length of germanium crystal from a germanium melt containing acceptor impurities, retarding the growth of said crystal, adding to said melt at least two donor impurities having different diffusion rates in germanium, together with an acceptor impurity having a diffusion rate in germanium slower than either of said donor impurities, growing another length of crystal, again retarding growth to permit diffusion from said another length into the previously-grown length, and thereafter growing an additional length of crystal.

2. The method as defined in claim 1 wherein the acceptor impurities originally contained in said melt comprise gallium.

3. The method as defined in claim 1 wherein said donor impurities comprise arsenic and antimony.

4. The method as defined in claim 1 wherein the acceptor impurity added to the melt comprises gallium.

5. The method of producing a grown germanium crystal for making PNIP germanium transistors which comprises the steps of growing a length of germanium crystal from a melt of germanium containing gallium as the dominant impurity, retarding the growth of the crystal by increasing the temperature of said melt and decreasing the withdrawal rate of said crystal, adding to said melt amounts of arsenic, antimony, and gallium, growing another length of crystal, again retarding growth to permit diffusion of arsenic and antimony into the previously-grown length, and thereafter growing an additional length of crystal.

6. A method of producing a grown germanium crystal for making improved PNIP germanium transistors which comprises the steps of growing a length of germanium crystal by withdrawing a seed from a germanium melt containing gallium at a concentration of about $5 \times 10^{15}$ atoms per cc., retarding the growth of said crystal by raising the temperature of said melt and decreasing the withdrawal rate of said crystal, adding to said melt a quantity of doping alloy comprising about 15% antimony, about 0.13% arsenic, about 3% gallium, and about 82% germanium, resuming the growth of said crystal for a period of time by raising the temperature of said melt and increasing the withdrawal rate, retarding the growth of said crystal for a relatively long period by raising the temperature and decreasing the withdrawal rate to allow diffusion of the impurity materials such that an essentially intrinsic-type region is formed by diffusion of said arsenic at a high rate and an N-type region is formed by diffusion of said antimony at a lower rate, and thereafter growing an additional length of crystal.

References Cited in the file of this patent

UNITED STATES PATENTS

| | | |
|---|---|---|
| 2,730,470 | Shockley | Jan. 10, 1956 |
| 2,767,358 | Early | Oct. 16, 1956 |
| 2,790,037 | Shockley | Apr. 23, 1957 |
| 2,822,308 | Hall | Feb. 4, 1958 |
| 2,843,515 | Statz | July 15, 1958 |
| 2,878,152 | Runyan | Mar. 17, 1959 |
| 2,899,343 | Statz | Aug. 11, 1959 |
| 2,977,256 | Lesk | Mar. 28, 1961 |

FOREIGN PATENTS

| | | |
|---|---|---|
| 779,666 | Great Britain | July 24, 1957 |
| 1,172,813 | France | Oct. 20, 1958 |